US008788902B2

(12) United States Patent
Chen et al.

(10) Patent No.: US 8,788,902 B2
(45) Date of Patent: Jul. 22, 2014

(54) METHOD AND DEVICE FOR BANDWIDTH SELF-ADAPTING DATA RANKING PROTECTION

(75) Inventors: Guangliang Chen, Shenzhen (CN); Dengjin Tong, Shenzhen (CN); Jianqiang Zhang, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 334 days.

(21) Appl. No.: 13/381,907

(22) PCT Filed: May 27, 2010

(86) PCT No.: PCT/CN2010/073313
§ 371 (c)(1),
(2), (4) Date: Mar. 1, 2012

(87) PCT Pub. No.: WO2011/000247
PCT Pub. Date: Jan. 6, 2011

(65) Prior Publication Data
US 2012/0272116 A1    Oct. 25, 2012

(30) Foreign Application Priority Data

Jul. 3, 2009    (CN) .......................... 2009 1 0088505

(51) Int. Cl.
*H03M 13/00*    (2006.01)
*H04L 1/00*    (2006.01)
*H03M 13/35*    (2006.01)

(52) U.S. Cl.
CPC ............. *H03M 13/353* (2013.01); *H04L 1/007* (2013.01); *H04L 1/0009* (2013.01)
USPC ....................................................... 714/752

(58) Field of Classification Search
CPC ... H04L 1/0057; H04L 1/0041; H04L 1/0009; H04L 1/0071; H03M 13/116; H03M 13/1111; H03M 13/1137; H03M 13/35
USPC ................................................. 714/774, 752
See application file for complete search history.

(56) References Cited

U.S. PATENT DOCUMENTS

| 7,554,989 B2 | 6/2009 | Leow et al. |
| 2003/0007508 A1* | 1/2003 | Sala et al. ..................... 370/468 |

(Continued)

FOREIGN PATENT DOCUMENTS

| CN | 1283376 A | 2/2001 |
| CN | 1808979 A | 7/2006 |

(Continued)

OTHER PUBLICATIONS

International Search Report on international application No. PCT/CN2010/073313, mailed on Sep. 2, 2010.

(Continued)

*Primary Examiner* — Ajay Bhatia
*Assistant Examiner* — Thien D Nguyen
(74) *Attorney, Agent, or Firm* — Oppedahl Patent Law Firm LLC

(57) ABSTRACT

The present disclosure discloses a method and a device for bandwidth self-adapting data ranking protection. The method comprises: performing redundancy protection computation on a data block to be transmitted so as to generate a redundant code of the data block, and setting a priority for the redundant code; determining whether bandwidth occupied by a redundant code with a highest priority is greater than current residual bandwidth; if the bandwidth occupied by the redundant code with the highest priority is not greater than the current residual bandwidth, carrying the redundant code with the highest priority in the current residual bandwidth; otherwise, according to a descending order of the priority, searching in residual redundant codes for a redundant code whose data amount is less than or equal to the current residual bandwidth, and carrying a found redundant code in the current residual bandwidth. The present disclosure improves the error tolerance of a system.

12 Claims, 2 Drawing Sheets

(56) References Cited

U.S. PATENT DOCUMENTS

| | | |
|---|---|---|
| 2004/0252688 A1 | 12/2004 | May |
| 2006/0159126 A1 | 7/2006 | Leow et al. |
| 2009/0232135 A1* | 9/2009 | Terui et al. ............ 370/389 |
| 2010/0005360 A1* | 1/2010 | Begen et al. ............ 714/751 |
| 2013/0117766 A1* | 5/2013 | Bax et al. ............ 719/323 |

FOREIGN PATENT DOCUMENTS

| | | |
|---|---|---|
| JP | 2000224218 A | 8/2000 |
| JP | 2000228676 A | 8/2000 |
| JP | 2001028752 A | 1/2001 |
| JP | 2002064472 A | 2/2002 |
| JP | 2002290974 A | 10/2002 |
| JP | 2002325095 A | 11/2002 |
| JP | 2005064648 A | 3/2005 |
| JP | 2005198191 A | 7/2005 |
| JP | 2006262288 A | 9/2006 |
| JP | 2008172465 A | 7/2008 |
| KR | 20080022071 A | 3/2008 |
| WO | 9910991 A2 | 3/1999 |
| WO | 03021832 A1 | 3/2003 |

OTHER PUBLICATIONS

English Translation of the Written Opinion of the International Search Authority in international application No. PCT/CN2010/073313, mailed on Sep. 2, 2010.

* cited by examiner

METHOD AND DEVICE FOR BANDWIDTH SELF-ADAPTING DATA RANKING PROTECTION

TECHNICAL FIELD

The present disclosure relates to the data ranking protection technology, and in particular to a method and a device for bandwidth self-adapting data ranking protection in a system having a fixed bandwidth and adopting a one-way communication technology.

BACKGROUND

The problems of large data capacity, code stream fluctuation, error codes and packet loss must be settled when real-time data are transmitted over a wireless channel with a fixed bandwidth. A traditional method solves the problems of large data capacity and code stream fluctuation by reserving certain bandwidth for the code stream to be transmitted, selects a suitable error correction code protection algorithm to protect the transmitted data, and solves the problems of error code and packet loss by adopting a retransmission technology and the like. However, the retransmission approach will become helpless in an environment with a strict demand on time delay and a limitation in retransmission, particularly in a one-way communication environment, for example, broadcast communication. Although the error correction code protection algorithm may improve the reliability of data transmission, it cannot completely and effectively solve the problem of error code; in particular, for some important data, once error code occurs, it will cause error spread and cause the whole transmitted data unable to be decoded.

SUMMARY

In view of the above, a main objective of the present disclosure is to provide a method and a device for bandwidth self-adapting data ranking protection, which can guarantee the reliability of the transmission and decoding of important data.

In order to achieve the objective, the technical solution of the present disclosure is implemented as follows.

A method for bandwidth self-adapting data ranking protection comprises:

performing redundancy protection computation on a data block to be transmitted so as to generate a redundant code of the data block, and setting a priority for the redundant code; and determining whether bandwidth occupied by a redundant code with a highest priority is greater than current residual bandwidth; if the bandwidth occupied by the redundant code with the highest priority is not greater than the current residual bandwidth, carrying the redundant code with the highest priority in the current residual bandwidth; otherwise, according to a descending order of the priority, searching in residual redundant codes for a redundant code whose data amount is less than or equal to the current residual bandwidth, and carrying a found redundant code in the current residual bandwidth.

Preferably, the method may further comprise: after carrying the redundant code in the current residual bandwidth, when it is determined that there still exists residual bandwidth, searching in the residual codes for a redundant code that can be carried in the residual bandwidth according to the descending order of the priority; when it is determined that, in the residual redundant codes, there does not exist a redundant code that can be carried in the residual bandwidth, terminating the process.

Preferably, when there are two or more redundant codes with the highest priority, and their respective data amount is less than or equal to the current residual bandwidth, any one of the redundant codes may be selected to be carried in the current residual bandwidth.

Preferably, the method may further comprise:

setting a priority for the data block to be transmitted, wherein the priority of the redundant code is same as that of the data block corresponding to the redundant code.

The present disclosure further provides a device for bandwidth self-adapting data ranking protection, comprising: a redundant code generating unit, a first setting unit, a searching unit and a carrying and transmitting unit, wherein the redundant code generating unit is configured to perform redundancy protection computation on a data block to be transmitted so as to generate a redundant code of the data block;

the first setting unit is configured to set a priority for the redundant code generated by the redundant code generating unit;

the first determining unit is configured to determine whether bandwidth occupied by data amount of a redundant code with a highest priority is greater than current residual bandwidth; if the bandwidth occupied by the redundant code with the highest priority is not greater than the current residual bandwidth, trigger the carrying and transmitting unit; otherwise, trigger the searching unit;

the searching unit is configured to search, in residual redundant codes, for a redundant code whose data amount is less than or equal to the current residual bandwidth according to a descending order of the priority, and trigger the carrying and transmitting unit; and the carrying and transmitting unit is configured to carry the redundant code with the highest priority whose data amount is less than or equal to the current residual bandwidth in the current residual bandwidth for transmission.

Preferably, the device may further comprise:

a second determining unit, configured to trigger the first determining unit when determining that there still exists residual bandwidth after the carrying and transmitting unit carries the redundant code in the current residual bandwidth.

Preferably, when there are two or more redundant codes with the highest priority and their respective data amount is less than or equal to the current residual bandwidth, the carrying and transmitting unit may select any one of the redundant codes and make the selected one carried in the current residual bandwidth.

Preferably, the device may further comprise:

a second setting unit, configured to set a priority for the data block to be transmitted, wherein the priority of the redundant code is same as that of the data block corresponding to the redundant code.

In the present disclosure, redundancy protection computation is performed on important data blocks; and the redundant code with the highest priority is carried in the current residual bandwidth according to the condition of the current residual bandwidth. According to the present disclosure, redundancy data of important data blocks can be transmitted by effectively utilizing the residual bandwidth in the bandwidth source, such that the reliability of transmission of important data is improved significantly, and the error tolerance of a system is improved as well.

DETAILED DESCRIPTION

The basic idea of the present disclosure is to perform redundancy protection computation on important data blocks, select a redundant code with the highest priority and make the selected one carried in a current residual bandwidth according to the condition of the current residual bandwidth. According to the present disclosure, redundancy data of important data blocks can be transmitted by effectively utilizing the residual bandwidth in the bandwidth source, such that the reliability of transmission of important data is improved significantly, and the error tolerance of a system is improved as well. The solution of the present disclosure is practical and easy to implement.

In order to make the objective, technical solutions and advantages of the present disclosure more elucidated, the present disclosure will be further described in detail through the embodiments with reference to the accompanying drawings.

Figure 1:
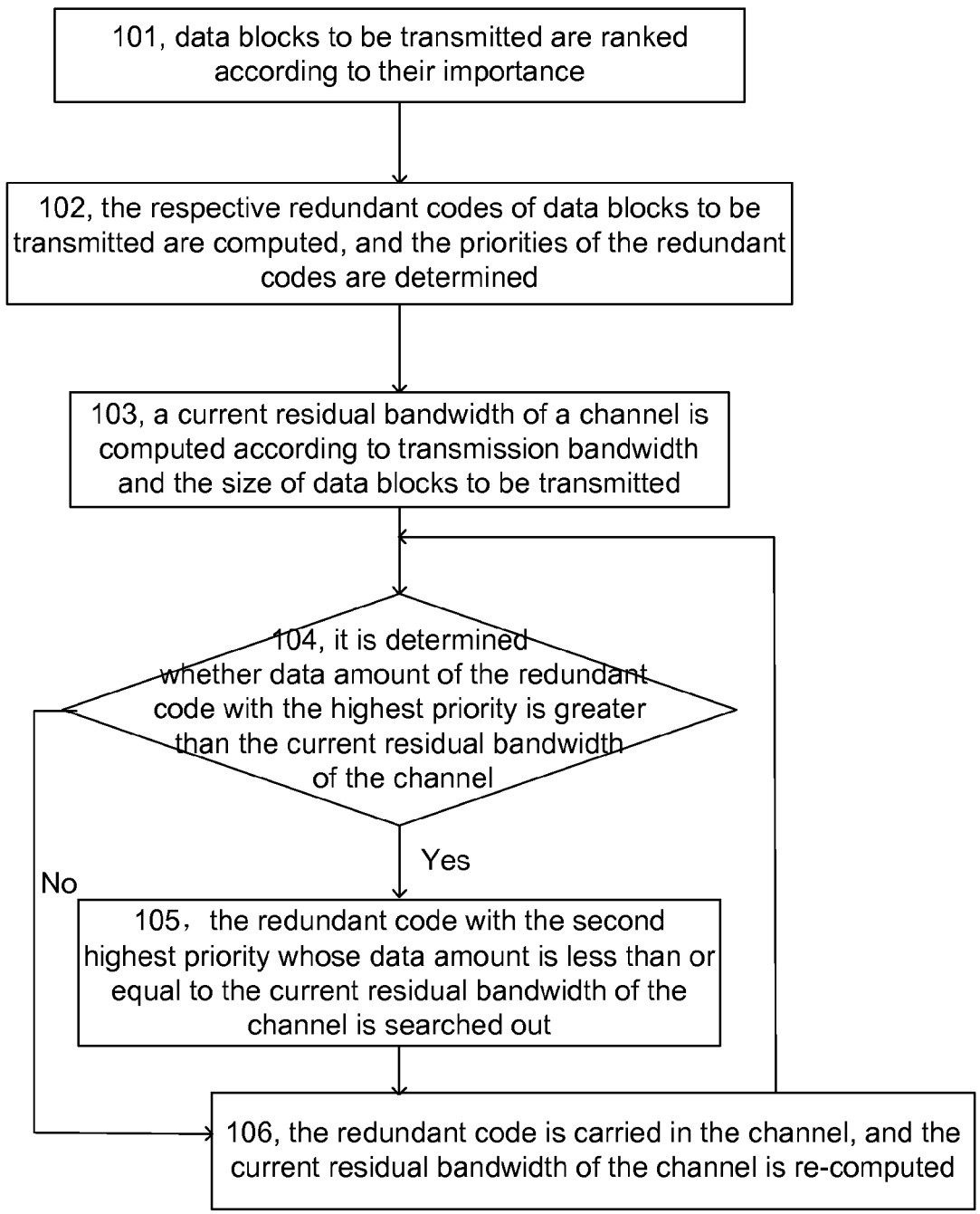
FIG. 1 shows a flowchart of a method for bandwidth self-adapting data ranking protection according to the present disclosure.

FIG. 1 shows a flowchart of a method for bandwidth self-adapting data ranking protection. As shown in FIG. 1, the method for bandwidth self-adapting data ranking protection according to the present disclosure comprises the following steps:

Step 101, data blocks to be transmitted are ranked according to their importance. Here, the data blocks in a multiplexing frame of a China Mobile Multimedia Broadcasting (CMMB) broadcast frame is taken as the example. The data blocks in the multiplexing frame of the CMMB broadcast frame are ranked according to the importance of the data. Here, the multiplexing frame header and the multiplexing sub-frame header are granted a higher priority 0; the video and audio data blocks are granted a normal priority 1; the video and audio enhanced data blocks are granted a lower priority 2, wherein the video and audio enhanced data blocks are supervise code elements generated after the video and audio data blocks are subjected to the Forward Error Correction (FEC) process, and the supervise code elements are the data for performing the FEC on the video and audio data blocks.

Step 102, the respective redundant codes of data blocks to be transmitted are computed, and the priorities of the redundant codes are determined;

redundant codes of the multiplexing frame and the multiplexing sub-frame header are computed and are granted a higher priority 0; redundant codes of the video and audio data blocks are computed and are granted a normal priority 1; redundant codes of the video and audio enhanced data blocks are computed and are granted a lower priority 2. In other words, redundancy protection computation is performed on each data block of each priority so as to compute the redundant code of each data block.

Step 103, a current residual bandwidth of a channel is computed according to transmission bandwidth and the size of data blocks to be transmitted:

The idle bandwidth of the transmission channel is computed according to the size of the data of the data blocks to be transmitted currently and the bandwidth of the transmission channel. In other words, it is determined whether there is residual bandwidth after the transmission channel carries the data blocks to be transmitted currently; if yes, Step 104 is executed; otherwise, the process is terminated.

Step 104, it is determined whether data amount of the redundant code with the highest priority is greater than the current residual bandwidth of the channel. The determination of whether the data amount of the redundant code with the highest priority being less than or equal to the residual bandwidth of the transmission channel means that: determining whether the redundant code with the highest priority can be carried in the transmission channel. If the data amount of the redundant code with the highest priority is less than or equal to the residual bandwidth of the transmission channel, Step 106 is executed; otherwise, Step 105 is executed. Generally speaking, for important data, the redundant codes thereof are computed, while for unimportant data, the redundant codes thereof are not computed. If there are important data blocks to be transmitted currently, there exist redundant codes. In the present disclosure, the transmission of the redundant code is performed only when there is residual bandwidth in the transmission channel. This means that not all the redundant codes of the data blocks can be transmitted, in this case, the transmission of the redundancy code of the data block with the highest priority is considered preferably.

Step 105, the redundant code with the second highest priority whose data amount is less than or equal to the current residual bandwidth of the channel is searched out. When the redundant code of the data block with the highest priority cannot be carried by the residual bandwidth of the transmission channel, the redundant code with the second highest priority which can be carried in the residual bandwidth of the transmission channel is searched for in the residual redundant codes. If there is an eligible redundant code in the residual redundant codes, Step 106 is executed; otherwise, the process is terminated.

Step 106, the redundant code is carried in the channel, and the current residual bandwidth of the channel is re-computed. The redundant code with the highest priority as determined in Step 104 is carried in the transmission channel for transmission; or the redundant code with the second highest priority whose data amount is less than or equal to the current residual bandwidth of the transmission channel as determined in Step 105 is carried in the transmission channel for transmission. Furthermore, the current residual bandwidth of the transmission channel is computed again; if there still exists residual bandwidth, back to Step 104 to determine whether there is enough residual bandwidth for carrying the current residual redundant code. The entire process is terminated until it is determined that no redundant code in the residual redundant codes can be carried in the residual bandwidth of the transmission channel.

In the present disclosure, when it is determined that redundant codes with the same priority can be carried in the residual bandwidth of the transmission channel, any one of the redundant codes is selected to be carried in the transmission channel, then the residual bandwidth of the transmission channel is computed again; if there still exists residual bandwidth, the selection of the redundant code is continued according to the way of Step 104.

Generally speaking, the priority of the data block is the same as that of the corresponding redundant code.

Taking the multiplexing data in the CMMB broadcast frame as an example. First, it is determined whether the length of the redundant code with the priority being 0 is greater than the idle bandwidth; if the length of the redundant code with the priority being 0 is less than or equal to the residual bandwidth of the transmission channel, the redundant code with the priority being 0 is placed into the transmission channel, and the residual bandwidth of the transmission channel is re-computed. Otherwise, Step 105 is performed to determine whether the length of the redundant code with the priority being 1 is greater than the residual bandwidth of the transmission channel; if the length of the redundant code with the priority being 1 is less than or equal to the residual bandwidth of the transmission channel, the redundant code with the priority being 1 is placed in the transmission channel, and the residual bandwidth of the transmission channel is re-computed. If the redundant code with the priority being 1 is greater than the residual bandwidth of the transmission channel, then it is determined whether the length of the redundant code with the priority being 2 is greater than the residual bandwidth of the transmission channel, until a redundant code whose length is found to be less than or equal to the residual bandwidth of the transmission channel. The process is terminated when no eligible redundant code can be found.

In the present disclosure, the bandwidth for carrying the redundant code generally belongs to the residual bandwidth; the receiving end can monitor the redundant code by receiving the corresponding residual bandwidth, and the receiving end also sets the information about the relationship between a redundant code and a data block, such that the receiving end can determine, when receiving a redundant code, to which data block the redundant code corresponds. Since the details of transmission are not the focus of the present disclosure, it will not be detailed here.

The present disclosure can improve the anti-error-code and anti-packet-loss functions of important data and improve the user experience.

Figure 2:
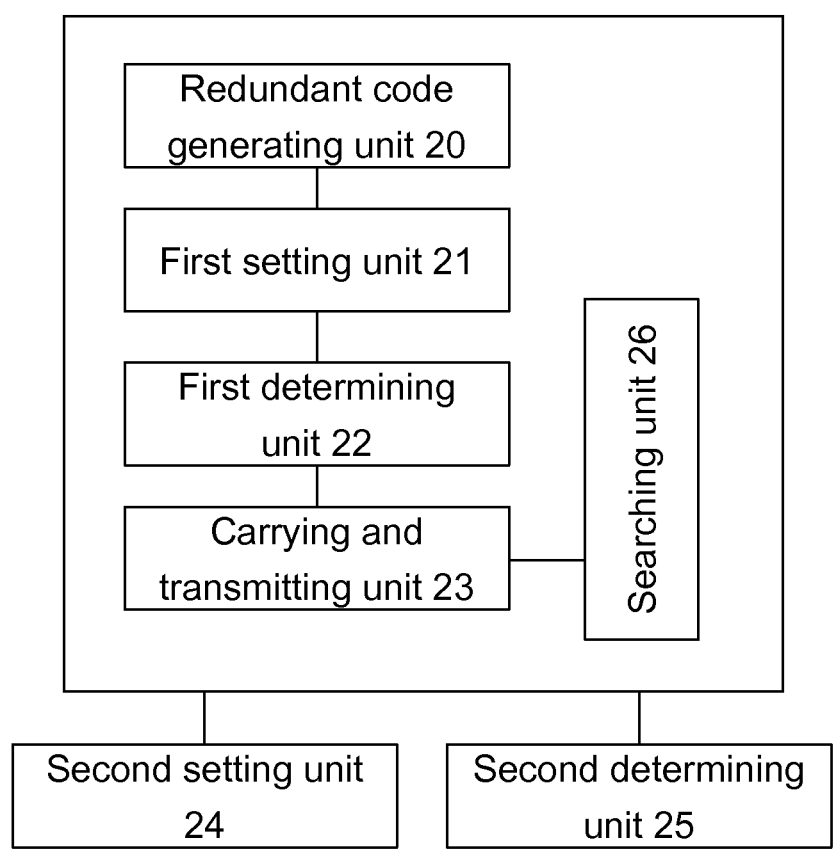
FIG. 2 shows an organizational structure diagram of a device for bandwidth self-adapting data ranking protection according to the present disclosure.

FIG. 2 shows an organizational structure diagram of a device for bandwidth self-adapting data ranking protection according to the present disclosure. As shown in FIG. 2, the device for bandwidth self-adapting data ranking protection according to the present disclosure comprises a redundant code generating unit 20, a first setting unit 21, a first determining unit 22, a searching unit 26 and a carrying and transmitting unit 23, wherein the redundant code generating unit 20 is configured to perform redundancy protection computation on a data block to be transmitted so as to generate a redundant code of the data block; the first setting unit 21 is configured to set a priority for the redundant code generated by the redundant code generating unit 20; the first determining unit 22 is configured to determine whether bandwidth occupied by data amount of a redundant code with a highest priority is greater than current residual bandwidth; if the bandwidth occupied by the redundant code with the highest priority is not greater than the current residual bandwidth, trigger the carrying and transmitting unit 23; otherwise, trigger the searching unit 26; the searching unit 26 is configured to search, in residual redundant codes, for a redundant code whose data amount is less than or equal to the current residual bandwidth according to a descending order of the priority, and trigger the carrying and transmitting unit 23; and the carrying and transmitting unit 23 is configured to carry the redundant code with the highest priority whose data amount is less than or equal to the current residual bandwidth in the current residual bandwidth for transmission. When there are two or more redundant codes with the highest priority and their respective data amount is less than or equal to the current residual bandwidth, the carrying and transmitting unit 23 selects any one of the redundant codes and makes the selected one carried in the current residual bandwidth.

As shown in FIG. 2, the device for bandwidth self-adapting data ranking protection according to the present disclosure further comprises a second determining unit 25, for configured to trigger the first determining unit 22 when determining that there still exists residual bandwidth after the carrying and transmitting unit 23 carries the redundant code in the current residual bandwidth.

As shown in FIG. 2, the device for bandwidth self-adapting data ranking protection according to the present disclosure further comprises a second setting unit 24, configured to set a priority for the data block to be transmitted, wherein the priority of the redundant code is same as that of the data block corresponding to the redundant code.

Those skilled in the art should appreciate that the second setting unit 24 and the second determining unit 25 are not essential technical features for implementing the device for bandwidth self-adapting data ranking protection shown in FIG. 2, which are only the optimized technical features.

Those skilled in the art should appreciate that the functions performed by respective processing units in the device for bandwidth self-adapting data ranking protection shown in FIG. 2 can be understood by referring to the relevant description in FIG. 1. The functions of respective processing units in the device for bandwidth self-adapting data ranking protection shown in FIG. 2 can be implemented through programs running on a processor or can be implemented through a specific logic circuit.

The above is only preferred embodiments of the present disclosure and not intended to limit the scope of protection of the present disclosure.

The invention claimed is:

1. A method for bandwidth self-adapting data ranking protection in a system having a fixed bandwidth and adopting a one-way communication technology, comprising:
   Performing, by a circuit, redundancy protection computation on a data block to be transmitted so as to generate a redundant code of the data block, and setting, by the circuit, a priority for the redundant code;
   determining, by the circuit, there is residual bandwidth after a transmission channel carries the data block to be transmitted;
   determining, by the circuit, whether bandwidth occupied by a redundant code with a highest priority is greater than the residual bandwidth; if the bandwidth occupied by the redundant code with the highest priority is not greater than the residual bandwidth, carrying, by the circuit, the redundant code with the highest priority in the residual bandwidth; otherwise, according to a descending order of the priority, searching, by the circuit, in residual redundant codes for a redundant code whose data amount is less than or equal to the residual bandwidth, and carrying, by the circuit, a found redundant code in the residual bandwidth.

2. The method according to claim 1, further comprising:
   after carrying, by the circuit, the redundant code in the residual bandwidth,
   when it is determined that there still exists residual bandwidth, searching, by the circuit, in the residual codes for a redundant code that can be carried in the residual bandwidth according to the descending order of the priority; when it is determined that, in the residual redundant codes, there does not exist a redundant code that can be carried in the residual bandwidth, terminating, by the circuit, the process.

3. The method according to claim 1, wherein
   when there are two or more redundant codes with the highest priority, and their respective data amount is less than or equal to the residual bandwidth, selecting, by the circuit, any one of the redundant codes and making the selected one carried in the residual bandwidth.

4. The method according to claim 1, further comprising:
setting, by the circuit, a priority for the data block to be transmitted, wherein the priority of the redundant code is same as that of the data block corresponding to the redundant code.

5. A device for bandwidth self-adapting data ranking protection in a system having a fixed bandwidth and adopting a one-way communication technology, comprising a redundant code generating unit, a first setting unit, a first determining unit, a searching unit and a carrying and transmitting unit, wherein
the redundant code generating unit is configured to perform redundancy protection computation on a data block to be transmitted so as to generate a redundant code of the data block;
the first setting unit is configured to set a priority for the redundant code generated by the redundant code generating unit;
the first determining unit is configured to, after determining there is residual bandwidth after a transmission channel carries the data block to be transmitted, determine whether bandwidth occupied by data amount of a redundant code with a highest priority is greater than the residual bandwidth; if the bandwidth occupied by the redundant code with the highest priority is not greater than the residual bandwidth, trigger the carrying and transmitting unit; otherwise, trigger the searching unit;
the searching unit is configured to search, in residual redundant codes, for a redundant code whose data amount is less than or equal to the residual bandwidth according to a descending order of the priority, and trigger the carrying and transmitting unit; and
the carrying and transmitting unit is configured to carry the redundant code with the highest priority whose data amount is less than or equal to the residual bandwidth in the residual bandwidth for transmission.

6. The device according to claim 5, further comprising:
a second determining unit, configured to trigger the first determining unit when determining that there still exists residual bandwidth after the carrying and transmitting unit carries the redundant code in the residual bandwidth.

7. The device according to claim 6, wherein when there are two or more redundant codes with the highest priority and their respective data amount is less than or equal to the residual bandwidth, the carrying and transmitting unit selects any one of the redundant codes and makes the selected one carried in the residual bandwidth.

8. The device according to claim 5, further comprising:
a second setting unit, configured to set a priority for the data block to be transmitted, wherein the priority of the redundant code is same as that of the data block corresponding to the redundant code.

9. The method according to claim 2, further comprising:
setting, by the circuit, a priority for the data block to be transmitted, wherein the priority of the redundant code is same as that of the data block corresponding to the redundant code.

10. The method according to claim 3, further comprising:
setting, by the circuit, a priority for the data block to be transmitted, wherein the priority of the redundant code is same as that of the data block corresponding to the redundant code.

11. The device according to claim 6, further comprising:
a second setting unit, configured to set a priority for the data block to be transmitted, wherein the priority of the redundant code is same as that of the data block corresponding to the redundant code.

12. The device according to claim 7, further comprising:
a second setting unit, configured to set a priority for the data block to be transmitted, wherein the priority of the redundant code is same as that of the data block corresponding to the redundant code.

\* \* \* \* \*